350-358 SR

XR 3,760,299

SEARCH ROOM

United Stat

Vasile

SUBSTITUTE FOR MISSING XR

[11] 3,760,299

[45] Sept. 18, 1973

[54] ACOUSTIC SURFACE WAVE-APPARATUS HAVING DIELECTRIC MATERIAL SEPARATING TRANSDUCER FROM ACOUSTIC MEDIUM

[75] Inventor: Carmine F. Vasile, Greenlawn, N.Y.

[73] Assignee: Hazeltine Corporation, Greenlawn, N.Y.

[22] Filed: Aug. 9, 1971

[21] Appl. No.: 170,168

[52] U.S. Cl. .............................. 333/30 R, 310/9.8
[51] Int. Cl. .............................. H03h 9/30
[58] Field of Search .............................. 333/30 R, 72; 310/8.1, 8.2, 9.2, 9.8

[56] References Cited

UNITED STATES PATENTS

| | | | |
|---|---|---|---|
| 3,621,328 | 11/1971 | Epstein et al. | 310/9.8 X |
| 3,686,518 | 8/1972 | Hartmann et al. | 333/30 R X |
| 3,689,784 | 9/1972 | DeKlerk | 310/9.8 |
| 3,446,975 | 5/1969 | Adler et al. | 333/72 X |
| 3,581,248 | 5/1971 | DeVries et al. | 333/72 |

OTHER PUBLICATIONS

Acoustic–Optic Deflector, Sadagopan et al., IBM Tech. Disclosure Bulletin, June 1970, page 99, 100.

*Primary Examiner*—Paul L. Gensler
*Attorney*—Edward A. Onders

[57] ABSTRACT

Disclosed are acoustic surface wave apparatus which utilize a novel transducing system to couple energy to and from an acoustic surface wave propagation medium. The transducing system includes a conventional electromechanical transducer having a plurality of fingers for coupling energy to or from the medium. To minimize bulk wave scattering and reradiation which would normally occur when surface waves propagating in a high piezoelectric medium encounter these fingers, the transducing system further includes a dielectric material which separates the fingers from the medium. In a specific embodiment this dielectric material consists of a relatively thin layer of low piezoelectric, low dielectric constant material, coating a portion of the surface of the propagating medium.

10 Claims, 5 Drawing Figures

Patented Sept. 18, 1973 3,760,299

2 Sheets-Sheet 2

ACOUSTIC SURFACE WAVE-APPARATUS HAVING DIELECTRIC MATERIAL SEPARATING TRANSDUCER FROM ACOUSTIC MEDIUM

BACKGROUND OF THE INVENTION

This invention relates to acoustic surface wave apparatus and more specifically to such apparatus which contains at least one electromechanical transducer having a plurality of conductive fingers for coupling energy to or from a surface wave propagation medium.

In recent times acoustic surface wave apparatus have been used to construct many useful and practical devices, such as pulse compression filters, delay lines, and matched filters. Because of the nature of acoustic surface wave propagation, it is possible to construct relatively low cost. light weight, low power, rugged and small devices in comparison with equivalent electronic filters, delay lines, etc.

However, one particular problem, which prior art acoustic surface wave devices have not been able to solve is that the transducers which couple energy to and from the propagation medium represent an obstacle to waves propagating in the medium. This problem is particularly acute when the transducer consists of a plurality of conductive fingers arranged along the surface of the propagation medium and connected together by a common bus rail (such as is common in tapped delay lines) since each of these fingers represent a periodic obstacle to the propagating surface wave and may cause appreciable bulk wave sacttering and reradiation. More specifically, as the propagating surface wave encounters each finger in this type of transducer a certain amount of energy is scattered in bulk waves in the propagation medium due to the piezoelectric disturbance caused by the fingers and their electrical terminations. This causes both amplitude and phase distortion in any output signal provided by a transducer on the medium. Furthermore, unless the load impedance of the bus rails is very low, reradiation will occur from each finger, further distorting the eventual output signal.

In order to minimize these distortions the propagation medium may be constructed from a low piezoelectric substance such as quartz. In such substances bulk wave scattering does not occur to any appreciable extent and reradiation can be easily minimized by conventional techniques. These techniques have heretofore been impractical for highly piezoelectric propagating media and therefore surface wave apparatus utilizing quartz have several desirable characteristics. One particular problem, however, in using quartz (or similar media) is its extremely high insertion loss due to its low coupling ability.

It is therefore an object of this invention to provide an acoustic surface wave transducing system which overcomes aforementioned bulk wave scattering and reradiation problems.

It is a further object of the invention to provide such a system used in connection with a surface wave propagation medium which has a relatively high piezoelectricity, thus providing a low insertion loss.

It is a still further object of the invention to provide an acoustic surface wave signal translating apparatus which utilizes such a transducing system as an energy coupling element.

SUMMARY OF THE INVENTION

In accordance with the invention there is provided an acoustic surface wave transudcing system which includes an acoustic surface wave propagation medium. Further included is an electromechanical transducer having a plurality of conductive fingers arranged on the medium, and a dielectric material separating the fingers from the medium. The combination of the transducer and the dielectric material forming a transducing system for coupling energy to and from the medium.

For a better understanding of the present invention, together with other and further objects thereof, reference is had to the following description taken in connection with the accompanying drawings and its scope will be pointed out in the appended claims.

DEFINITIONS AND THEORETICAL CONSIDERATIONS

Figure 1:
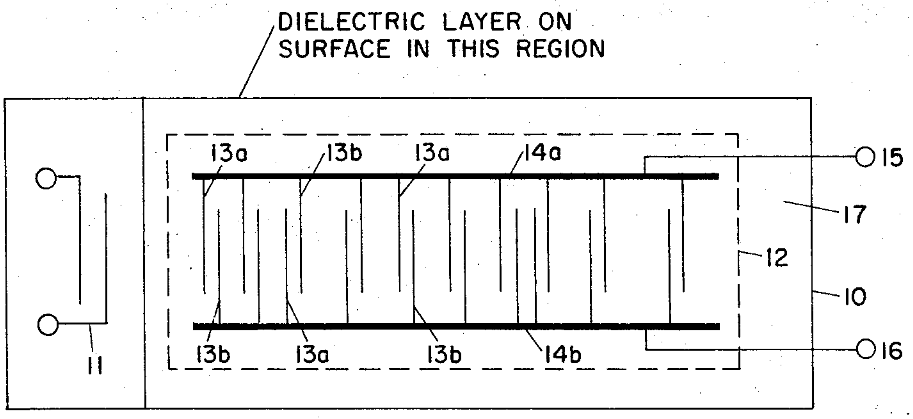
FIG. 1 is an acoustic surface wave tapped delay line embodying the invention.

Acoustic surface wave apparatus have many different applications and therefore are constructed in many different configurations. For example, they can be used for tapped delay lines, tapped delay line matched filters, pulse compression filters and many other useful devices. All such apparatus however make use of a surface wave propagation medium and one or more electromechanical transducers for coupling energy to and from this medium thereby causing surface waves to propagate along it.

The surface wave propagation media are generally constructed from piezoelectric materials which, for purposes of this application, include all materials capable of supporting surface wave propagation, whether they be natural piezoelectrics, artificial piezoelectrics (i.e., poled ferro electrics) or combination materials which are only partly piezoelectric.

Piezoelectric materials have the property of undergoing and elastic distortion in response to an impinging electric field. This distortion causes surface waves to propagate along the medium. Naturally for a given impinging electric field some materials (i.e. highly piezoelectric) undergo more distortion than others and consequently have a greater ability to convert electrical energy to mechanical energy and vice versa. The sensitivity of any particular material to an impinging field is herein called the coupling ability of the material. The higher this coupling ability is, the more desirable the material is for surface wave apparatus. This is because media having a low piezoelectricity such as quartz will, when incorporated in a surface wave apparatus, cause a high insertion loss due to their poor coupling ability. On the other hand, media having a higher piezoelectricity such as lithium niobate will have a corresponding lower insertion loss due to their high coupling ability.

To couple energy to and from the medium all surface wave apparatus use one or more electromechanical transducers. While many varieties and shapes of such transducers exist, for purposes of this application, transducer is defined as any element which couples energy to or from the propagating medium. The transducers may be classified in two broad categories, those which launch surface waves into the medium (input transducers) and those which, in response to the electric field which travels with the wave distrubance, supply an output signal to a load (output transducers). Therefore a surface wave apparatus may contain many individual energy coupling elements (sometimes termed transducer fingers, finger pairs, or taps) which couple energy to or from the medium and which may be connected together in many different formats. However, for purposes of this application all the elements which couple energy to the medium will be considered together and called the "input transducer" and all the elements which couple energy from the medium will be likewise considered together and called the "output transducer." It will be recognized by those skilled in the art that the above refers only to the transducer as it is used for a specific application since most surface wave devices are reciprocal and therefore an input transducer for one application may be used as an output transducer for another. In fact in some cases the input and output transducer may be the same transducer used to both launch waves into the medium during a first time interval and receive them from the medium during a different time interval.

In many surface wave apparatus one or both of these transducers may consist of a plurality of conductive fingers arranged on a surface of the medium and in the path of the wave disturbance. These fingers (somewhat like conventional radio antennas radiating in space) either project an electric field through the surface of the medium or sense the electric field moving in the medium. Generally these fingers are matched to a particular signal format so that signals may be translated from one format to another. For example, in an acoustic surface wave matched filter one transducer may be matched to a single pulse type signal, while a second transducer may have its fingers arranged to be responsive to a coded pulse train. In this manner, as is well known in the art, the pulse train may be translated into single pulse and vice versa. As previously stated, it is where one of these transducers contains a plurality of such fingers that undesirable bulk wave scattering and reradiation occurs.

DESCRIPTION AND OPERATION OF THE EMBODIMENT OF FIG. 1

To illustrate the problem and the unique solution a tapped delay line embodying the invention is shown in FIG. 1. The FIG. 1 embodiment is presented solely by way of example to illustrate the concept of the invention. Those skilled in the art will recognize that the invention's use is not limited to tapped delay lines but may be easily adapted for use in other acoustic surface wave apparatus.

The FIG. 1 embodiment includes a rectangularly shaped surface wave propgation medium 10, and first and second transducers 11 and 12 respectively, arranged on the surface of the medium. Either of these may be considered the input transducer since the device is reciprocal, but for purposes of simplicity it is assumed that transducer 11, a conventional launching transducer, is utilized as the input transducer. Transducer 12 is therefore utilized as an output transducer and consists of a plurality of fingers 13 arranged in pairs (*a* and *b*) of adjacent fingers, each pair comprising a tap on the delay line formed by medium 10. Also included in transducer 12 is a pair of bus rails 14*a* and 14*b* which provide a common terminal for the fingers 13. Therefore when an electrical signal, such as a pulse, is supplied to transducer 11, a surface wave corresponding to this pulse is caused to propagate along the surface of medium 10. Since the velocity of this surface wave is relatively slow when compared with the velocity of the electrical signal in a conductor, the surface wave encounters each of the finger pairs (13*a* and *b*) in time sequence inducing a pulse therebetween and thus forming a train of delayed pulses between output terminals 15 and 16 in a manner well known in the art.

Figure 3:
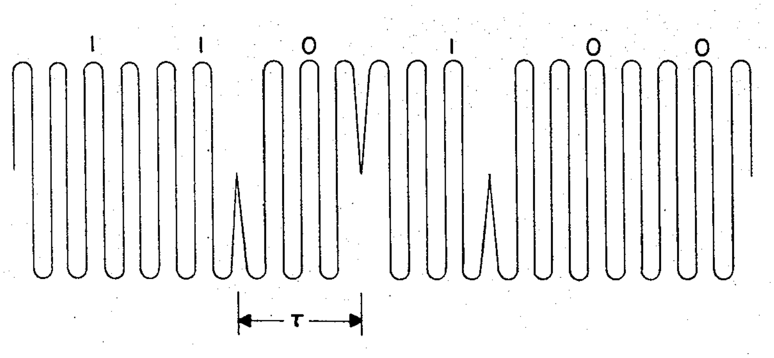
FIG. 3 is an example of a typical input signal supplied to a matched filter using the tapped delay line of FIG. 1.
Figure 4:
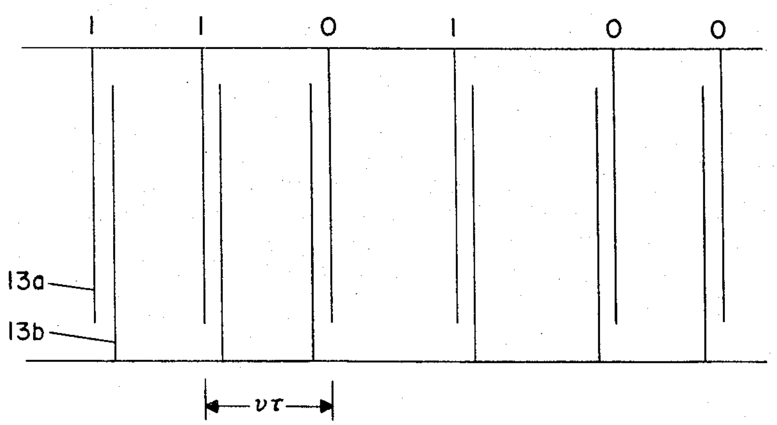
FIG. 4 shows a coded arrangement for the fingers in the tapped delay line of FIG. 1.
Figure 5:
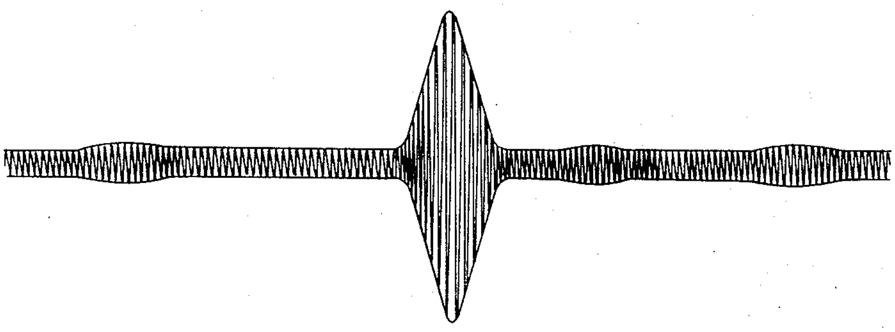
FIG. 5 shows the output obtained from the tapped delay line of FIG. 1 in response to the input signal of FIG. 3.

The polarity of these output pulses is controlled by the orientation of the fingers 13 within each finger pair (13*a* and *b*). If in any particular finger pair, finger 13*a* is connected to bus rail 14*a* and finger 13*b* is connected to bus rail 14*b*, then the pulse appearing between termianls 15 and 16 will have one polarity. On the other hand if, in the same finger pair, finger 13*a* is connected to bus rail 14*b* and finger 13*b* is connected to bus rail 14*a* then the pulse appearing between terminals 15 and 16 will have an opposite polarity. This, of course, makes this apparatus ideal for use as a matched filter since the spacing and orientation of these finger pairs can be selected to be responsive to a predetermined code in a manner well known in the art. For example, if the input signal is a phase flipped carrier such as that shown in FIG. 3 (with ones and zeroes being indicated on the drawing to show the polarity of pulses in the supplied signal), and if the orientation of taps 13*a* and 13*b* were selected to cprrespond to the 1's and 0's of the phase flipped signal as shown in FIG. 4 then the output signal would consist of a correlated burst of carrier such as shown in FIG. 5. Any other coding for the input signal would not produce the correlated output of FIG. 5, since the phase flipped portions of the input signal would not correspond to the 1's and 0's of the taps 13.

Until now what has been described is very similar to the well known prior art devices and as previously stated, if high piezoelectric substances are used for medium 10, bulk wave scattering and reradiation would normally occur when the wave disturbance encounters each finger 13. If low piezoelectric substances such as quartz are used for medium 10 some of these distortions could be minimized. This is because bulk wave scattering does not occur to any appreciable extent in low piezoelectrics and could be minimized by simply keeping the mass of the fingers low. Furthermore, since the impedance of the low piezoelectric is relatively high, reradiation can be minimized simply by utilizing a sufficiently low load impedance (i.e. by shorting bus rails 14*a* and 14*b* to ground).

Such solutions do not work, however, with higher piezoelectric propagation media such as lithium niobate, since the coupling ability of these substances is so great that even small metallic obstructions (such as the finger 13) on the medium can cause appreciable bulk wave scattering. Furthermore, since the dielectric constant of the medium itself is high (30–40 in the case of lithium niobate) it becomes difficult to sufficiently lower the load impedance of bus rails 14 to eliminate the effects of reradiation. This is because the distributed inductance of the bus rail and finger capacitance form a low pass filter structure which will permit a variation in voltage along the bus rail (i.e. the fingers are no longer in parallel). This variation prevents aforementioned shorting techniques from being effective in reducing reradiation.

Figure 2:
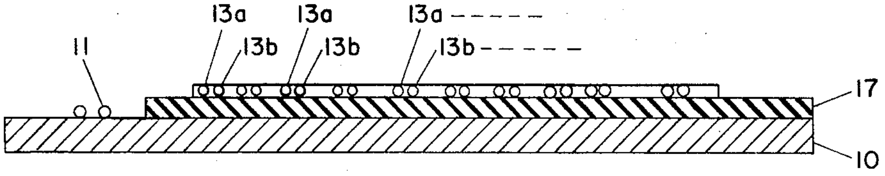
FIG. 2 is a cross sectional side view of the tapped delay line of FIG. 1.

To take advantage then of the low insertion loss of a highly piezoelectric substance and yet not have the severe distortion that normally occurs, it would be desirable to have a composite material consisting of the desirable qualities of both low and high piezoelectric substances. It has been discovered that this can be achieved by separating fingers 13 from medium 10 by a dielectric material such as the relatively thin layer of dielectric material 17 shown more clearly in the cross sectional side view of FIG. 2. (However, in FIG. 2 the thickness of the layer is greatly exaggerated for purposes of clarity). The material 17 is arranged directly on the surface of medium 10 and transducer 12 is arranged directly on the material 17 and is therefore separated from medium 10 by it.

Although in the FIG. 1 embodiment, material 17 is shown only under the output transducer 12, material 17 may be included under either or both transducers 11 and 12 to minimize distortion. This is especially useful when both transducers contain a plurality of fingers, however, in the FIG. 1 embodiment material 17 is contained only in the portion of medium 10 which includes transducer 12 in order to minimize distortions in this transducer and at the same time maximize the coupling ability of transducer 11. just Dielectric material 17 together with transducer 12 forms a novel transducing system through which energy can be coupled to and from medium 10. The dielectric material has a two fold purpose. First, the material may be selected to have a low dielectric constant with respect to medium 10. This in effect inserts a series capacitance between medium 10 and fingers 13, decoupling somewhat the fingers from the medium and thus raising the impedance level of medium 10 with respect to the fingers 13 and bus rail 14. Therefore, just as if quartz were used for medium 10, the bus rails 14 can now be easily loaded or shorted electrically to minimize or eliminate reradiation. (The signals contained on these bus rails can still be utilized because the short circuit current can be measured and if desired, amplified). Thus, by employing the invention reradiation can be minimized even if a high piezoelectric medium 10 is used.

A second function of material 17 is to minimize the bulk wave scattering which would normally occur when surface waves traveling in the medium encounter the metallic obstructions represented by fingers 13. To accomplish this, the material 17 may be selected to have a low piezoelectricity, thus separating fingers 13 from medium 10 by a material which like quartz does not experience as much bulk wave scattering at the point of obstruction as would a high piezoelectric. The material 17 also raises the fingers somewhat above the surface of medium 10 and therefore somewhat above the electric field traveling with the wave disturbance, this further decouples the fingers from the medium and enhances the ability of the transducing system (illustrated by material 17 and transducer 12) to minimize bulk wave scattering as well as reradiation.

While many configurations for separating the fingers 13 from medium 10 are possible, the easiest to fabricate is the one illustrated in FIG. 1 in which a relatively thin uniform layer of dielectric material 17 is arranged directly on the surface of medium 10 (for example by vacuum depositing) with fingers 13 being arranged on the layer 17 (for example by photo etching). This arrangement provides a transducing system which achieves a uniform amount of decoupling for each finger. Preferably the layer of material 17 is made relatively thin with respect to the wavelength of the surface wave to insure that this layer will not itself produce distortions by dispersing the propagating wave. Making the layer thin also insures that even when the layer has a low dielectric constant and piezoelectricity, with respect to medium 10, there is not an unacceptable increase in insertion loss. It has been found that layers approximately between one/thirtieth and one/fifteenth of a wavelength of the propagating surface wave provide sufficient decoupling when medium 10 is lithium niobate (dielectric constant approximately 30–40) and material 17 is silicon monoxide (dielectric constant approximately 4), without causing appreciable distortions or increase in insertion loss. Of course depending on the medium 10 employed, the amount of insertion loss which can be tolerated and the amount of bulk wave scattering and reradiation which can be tolerated, different thicknesses, or materials 17 may be utilized producing different amounts of decoupling. The important factor in selecting materials and thicknesses is that as the thickness of the layer increases the likelihood of its causing distortions and increasing inserting loss also increases, and therefore for best results as thin a layer as will provide sufficient decoupling should be utilized. In most cases layers which are less than one-half a wavelength will provide acceptable results.

It will be recognized that while FIG. 1 illustrates dielectric material 17 arranged as a uniform layer this is not a necessary requirement of the invention. Material 17 may be nonuniform in thickness to achieve a nonuniform amount of decoupling or alternatively may be omitted altogether from between finger pairs and contained only under the fingers. However, these nonuniformities in material 17 may themselves result in bulk wave scattering and therefore should be kept as small as possible.

While it is apparent from the above that the invention herein described is especially useful when the surface wave propagation medium is of a high piezoelectricity since this allows the reradiation and bulk wave scattering to be minimized without sacrificing any of the other advantages of highly active substances (i.e. the low insertion loss) it will be recognized that the invention may be used with all types of propagation media, accomplishing similar results with lesser active materials which have inherent disadvantages in themselves. This is especially true when there is a large number of fingers in the transducer making reradiation a serious problem even for low piezoelectric media.

The following example is presented to show one typical tapped delay line matched filter which has been constructed and successfully operated in accordance with the teachings of the invention. The following specifications are presented solely for purposes of illustration and are not to be construed as limiting the invention herein described in any way.

1. Surface wave propagation medium — rectangularly shaped slab of lithium niobate.

2. Finger pairs in output transducer — 255

3. Material for finger pairs — 800 A copper (if high carrier frequencies are used aluminum may be a more suitable material).

4. Carrier frequency of input signal — 60 MHz

5. Bit rate — 10 M. Bits per second

6. Dielectric layer — 30,000 A thick layer of silicon monoxide separating the finger pairs of the output transducer from the medium of 1, but not separating the input transducer from the medium.

The above device was found to almost completely eliminate the problem of bulk wave scattering and reradiation in a tapped delay line matched filter while providing about 2dB of net insertion loss (in response to an input signal matched to the taps on the delay line), as compared to approximately 48dB for a similar filter using quartz for the surface wave propagation medium, and without the novel use of dielectric layer.

While there have been described what are at present considered to be the preferred embodiments of this invention, it will be obvious to those skilled in the art that various changes and modifications may be made herein without departing from the invention.

What is claimed is:

1. An acoustic surface wave transducing system, comprising:

an acoustic surface wave propagation medium;

an electromechanical transducer having a plurality of conductive fingers arranged on said medium;

and a dielectric material separating all of the fingers which comprise said transducer from said medium;

whereby the combination of said transducer and said dielectric material forms a transducing system for coupling energy to and from said propagation medium.

2. A system in accordance with claim 1 wherein said dielectric material comprises a layer of dielectric material arranged directly on said medium, said layer being relatively thin with respect to the wavelength of surface waves propagating in said medium.

3. A system in accordance with claim 2 wherein the thickness of said layer is less than one-half a wavelength and is uniform thereby providing a transducing system having a uniform coupling ability for each of said plurality of fingers.

4. A system in accordance with claim 3 wherein said dielectric has a low dielectric constant with respect to said medium, thereby providing a transducing system in which reradiation can be minimized.

5. A system in accordance with claim 3 wherein said dielectric material has a low piezoelectricity with respect to said medium, thereby providing a transducing system in which bulk wave scattering is minimized.

6. An acoustic surface wave transducing system, comprising:

an acoustic surface wave progation medium;

an electromechanical transducer having a plurality of conductive fingers arranged on said medium;

and a dielectric material separating all of the fingers which comprise said transducer from said medium and having a relatively low dielectric constant and piezoelectricity with respect to said medium;

whereby the combination of said transducer and said dielectric material forms a transducing system in which the low piezoelectricity of said dielectric material minimizes bulk wave scattering and in which the low dielectric constant of said material enables minimization of reradiation.

7. A system in accordance with claim 6 wherein said dielectric material comprises a layer of dielectric material arranged directly on said medium, said layer being relatively thin with respect to the wavelength of surface waves propagating in said medium.

8. A system in accordance with claim 7 wherein the thickness of said layer is less than one-half a wavelength and is uniform thereby providing a transducing system having a uniform coupling ability for each of said plurality of fingers.

9. A system in accordance with claim 8 wherein said medium is lithium niobate and wherein said dielectric layer is silicon monoxide and has a thickness approximately between one/thirtieth and one/fifteenth of the wavelength of surface waves propagating in said medium.

10. An acoustic surface wave tapped delay line, useful as a matched filter, comprising:

an acoustic surface wave propagation medium which imparts a finite time delay to surface waves traveling between two points on said medium;

a dielectric material arranged directly on a portion of said medium, said layer being relatively thin with respect to the wavelength of surface waves propagating in said medium and having a relatively low piezoelectricity and dielectric constant with respect to said medium;

and first and second electromechanical transducers, arranged entirely on said medium, at least one of which has a plurality of finger pairs each corresponding to a tap on said medium;

whereby, when surface waves are launched by one of said transducers, they encounter the finger pairs of the other transducer in time sequence due to the wave propagation velocity of said medium, creating a tapped delay line in which the low piezoelectricity of said dielectric material minimizes bulk wave scattering and in which the low dielectric constant of said dielectric material enables minimization of reradiation.

* * * * *